United States Patent
Cho et al.

(10) Patent No.: US 7,782,666 B2
(45) Date of Patent: Aug. 24, 2010

(54) APPARATUS AND METHOD OF MULTI-BIT PROGRAMMING

(75) Inventors: Kyoung Lae Cho, Yongin-si (KR); Yoon Dong Park, Yongin-si (KR); Jun Jin Kong, Yongin-si (KR); Seung Hoon Lee, Seoul (KR); Jung Hun Sung, Yongin-si (KR); Sung-Jae Byun, Yongin-si (KR); Seung-Hwan Song, Incheon (KR); Donghun Yu, Seoul (KR); Sung Chung Park, Daejeon (KR); Heeseok Eun, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 193 days.

(21) Appl. No.: 12/076,392

(22) Filed: Mar. 18, 2008

(65) Prior Publication Data
US 2009/0109748 A1    Apr. 30, 2009

(30) Foreign Application Priority Data
Oct. 25, 2007   (KR) ................ 10-2007-0108026

(51) Int. Cl.
*G11C 16/04*   (2006.01)
(52) U.S. Cl. ............... 365/185.03; 365/185.2; 365/185.18; 365/185.22; 365/185.24
(58) Field of Classification Search ............ 365/185.03, 365/185.2, 185.18, 185.22, 185.24
See application file for complete search history.

(56) References Cited

U.S. PATENT DOCUMENTS

| | | | | |
|---|---|---|---|---|
| 5,768,188 A * | 6/1998 | Park et al. | ............ | 365/185.03 |
| 6,246,613 B1 * | 6/2001 | Banks | ............ | 365/189.15 |
| 6,529,405 B2 * | 3/2003 | Chang | ............ | 365/185.03 |
| 6,738,289 B2 * | 5/2004 | Gongwer et al. | ....... | 365/185.12 |
| 6,819,592 B2 * | 11/2004 | Noguchi et al. | ........ | 365/185.17 |
| 6,882,567 B1 * | 4/2005 | Wong | ............ | 365/185.03 |
| 6,954,380 B2 * | 10/2005 | Ono et al. | ............. | 365/185.24 |
| 7,272,040 B2 * | 9/2007 | Mikolajick et al. | ..... | 365/185.03 |
| 7,298,648 B2 * | 11/2007 | Lee et al. | ............... | 365/185.03 |
| 7,471,559 B2 * | 12/2008 | Shibata | ............... | 365/185.03 |
| 7,480,177 B2 * | 1/2009 | Lee et al. | ............... | 365/185.03 |
| 7,613,048 B2 * | 11/2009 | Inoue et al. | ........... | 365/185.24 |
| 2007/0115719 A1 | 5/2007 | Wu | | |
| 2007/0171726 A1 | 7/2007 | Kang et al. | | |

FOREIGN PATENT DOCUMENTS

| | | |
|---|---|---|
| JP | 2004-334956 | 11/2004 |
| JP | 2005-267687 | 9/2005 |
| JP | 2006-331618 | 12/2006 |

* cited by examiner

*Primary Examiner*—Viet Q Nguyen
(74) *Attorney, Agent, or Firm*—Harness, Dickey & Pierce, P.L.C.

(57) ABSTRACT

Multi-bit programming apparatuses and/or methods are provided. A multi-bit programming apparatus may include: a first control unit that allocates any one of $2^N$ threshold voltage states to the N-bit data; a second control unit that spaces, by any one of a first interval and a second interval, adjacent threshold voltage states of the $2^N$ threshold voltage states; and a programming unit that programs the N-bit data by generating, in each of the at least one multi-bit cell, a distribution state corresponding to the allocated threshold voltage state. The multi-bit programming apparatus can reduce an error rate when reading data.

19 Claims, 7 Drawing Sheets

APPARATUS AND METHOD OF MULTI-BIT PROGRAMMING

PRIORITY STATEMENT

This application claims priority from Korean Patent Application No. 10-2007-0108026, filed on Oct. 25, 2007, in the Korean Intellectual Property Office (KIPO), the entire contents of which are incorporated herein by reference.

BACKGROUND

1. Field

Example embodiments relate to apparatuses and/or methods that may program data in memory devices. Also, example embodiments relate to multi-bit (multi-level) programming apparatuses and/or methods that may program data in multi-level memory devices.

2. Description of Related Art

A single-level cell (SLC) memory device stores one bit of data in a single memory cell. The SLC memory is referred to as a single-bit cell (SBC) memory. The SLC memory stores and reads data of one bit at a voltage level included in two distributions that are divided by a threshold voltage level programmed in a memory cell. The programmed threshold voltage has a distribution within a certain range due to a fine electric characteristic difference between the SLC memories. For example, when a voltage level read from the memory cell is greater than 0.5V and less than 1.5V, it is determined that the data stored in the memory cell has a logic value of "1". When the voltage level read from the memory cell is greater than 2.5V and less than 3.5V, it is determined that the data stored in the memory cell has a logic value of "0". The data stored in the memory cell is classified depending on the difference between cell currents and/or cell voltages during the reading operations.

Meanwhile, a multi-level cell (MLC) memory device that can store data of two or more bits in a single memory cell has been proposed in response to a need for higher integration of memory. The MLC memory device is also referred to as a multi-bit cell (MBC) memory. However, as the number of bits stored in the single memory cell increases, reliability deteriorates and read-failure rate increases. To store 'm' bits in a single memory cell, $2^m$ voltage level distributions are required. But, since the voltage window for a memory device is limited, the difference in threshold voltage between adjacent bits decreases as 'm' increases, causing the read-failure rate to increase. For this reason, it is difficult to improve storage density using the MLC memory device according to a conventional art.

Accordingly, an MLC memory device is being widely used and thus new multi-level (multi-bit) programming apparatuses and/or methods of changing a data storing process are proposed in order to reduce a read-failure rate in the present specification.

SUMMARY

Example embodiments may provide apparatuses and/or methods that may apply a new multi-level (multi-bit) programming scheme to a multi-level cell (MLC) memory device and thereby reduce a read-failure rate.

Example embodiments also may provide apparatuses and/or methods that may apply a new multi-level (multi-bit) programming scheme to an MLC memory device and thereby efficiently adjust a distribution of a threshold voltage of an MLC in a limited voltage window.

According to example embodiments, a multi-bit programming apparatus may include: a first control unit that allocates any one of $2^N$ threshold voltage states to the N-bit data; a second control unit that spaces, by any one of a first interval and a second interval, adjacent threshold voltage states of the $2^N$ threshold voltage states; and a programming unit that programs the N-bit data by generating, in each of the at least one multi-bit cell, a distribution state corresponding to the allocated threshold voltage state.

According to another example embodiments, a multi-bit programming method that programs N-bit data in at least one multi-bit cell may include: allocating any one of $2^N$ threshold voltage states to the N-bit data; spacing, by any one of a first interval and a second interval, adjacent threshold voltage states of the $2^N$ threshold voltage states; and programming the N-bit data in each of the at least one multi-bit cell by generating, in each of the at least one multi-bit cell, a distribution state corresponding to the allocated threshold voltage state.

BRIEF DESCRIPTION OF THE DRAWINGS

The above and/or other aspects, and advantages will become more apparent and more readily appreciated from the following detailed description of example embodiments, taken in conjunction with the accompanying drawings, in which.

DETAILED DESCRIPTION OF EXAMPLE EMBODIMENTS

Figure 1:
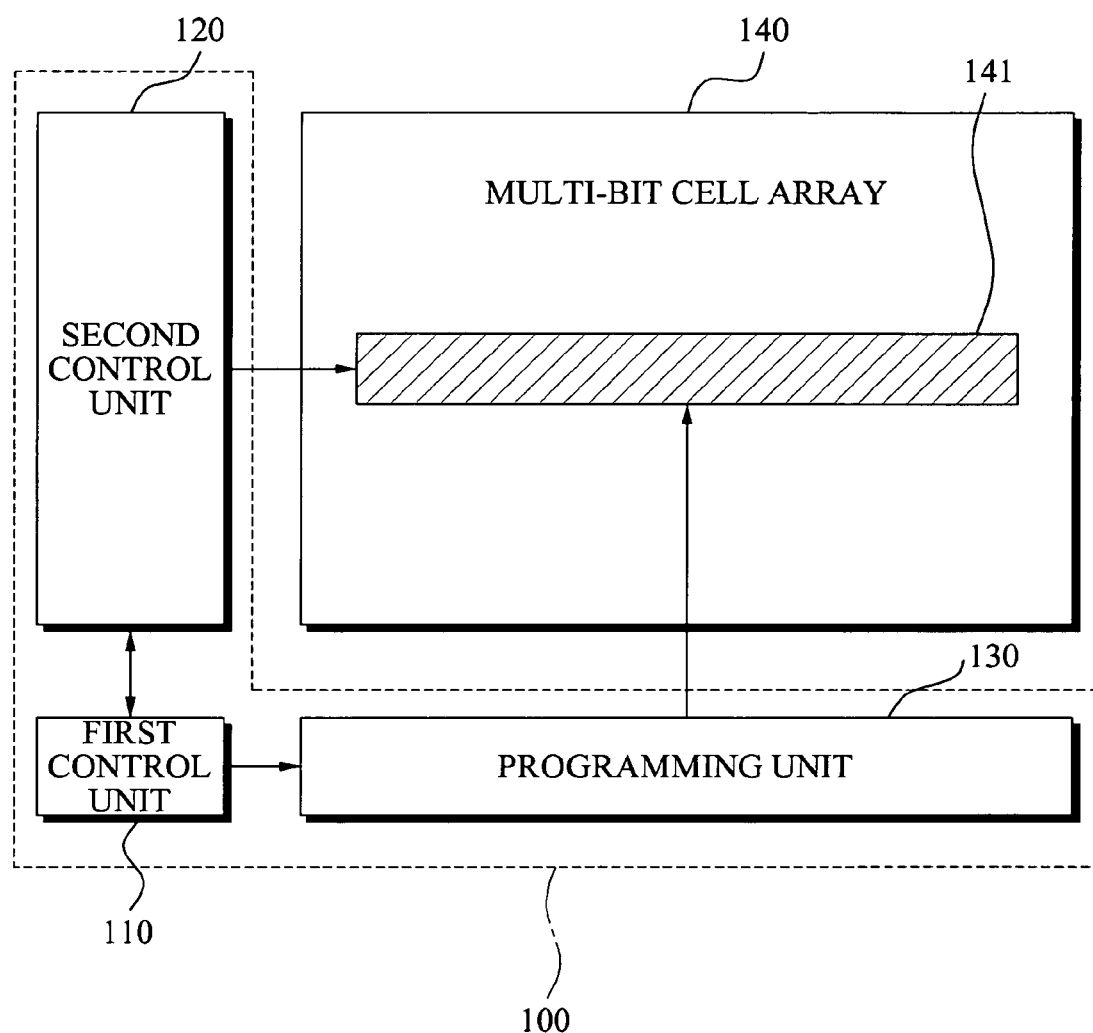
FIG. 1 is a diagram illustrating a multi-bit programming apparatus according to an example embodiment.

Example embodiments will now be described more fully with reference to the accompanying drawings. Embodiments, however, may be embodied in many different forms and should not be construed as being limited to example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

FIG. 1 is a diagram illustrating a multi-bit programming apparatus 100 according to an example embodiment.

Referring to FIG. 1, the multi-bit programming apparatus 100 programs N×M-bit data in a page 141 of a multi-bit cell array 140.

The page 141 includes simultaneously-programmed 'M' multi-bit cells.

N-bit data is programmed in at least one multi-bit cell.

The multi-bit programming apparatus 100 may include a first control unit 110, a second control unit 120, and a programming unit 130.

The first control unit 110 allocates any one of $2^N$ threshold voltage states to the N-bit data.

For example, in the case of N=2, the first control unit 110 allocates any one of four threshold voltage states to the 2-bit data. The first threshold voltage state is allocated to data "11", and the second threshold voltage state is allocated to data "10". Similarly, the third threshold voltage state is allocated to data "01", and the fourth threshold voltage state is allocated to data "00".

The first control unit 110 allocates any one of the $2^N$ threshold voltage states to the data programmed in each of a plurality of multi-bit cells included in the page 141.

In example embodiments, each of the threshold voltage states allocated by the first control unit 110 is the threshold voltage state in which a mutual sequence is determined. For example, the second threshold voltage state denotes a threshold voltage higher than the first threshold voltage state, and the third threshold voltage state denotes a threshold voltage higher than the second threshold voltage state.

The second control unit 120 spaces, by any one of a first interval and a second interval, adjacent threshold voltage states of the $2^N$ threshold voltage states.

For example, the second control unit 120 may set an interval between the first threshold voltage state and the second threshold voltage state as the first interval, and set an interval between the second threshold voltage state and the third threshold voltage state as the second interval.

The programming unit 130 generates, in each of the multi-bit cells of the page 141, a distribution state corresponding to the allocated threshold voltage state. When the distribution state is generated in each of the multi-bit cells, each of the multi-bit cells may be regarded as storing the data corresponding to the threshold voltage state.

For example, when the distribution state generated in the first multi-bit cell corresponds the first threshold voltage state, the data stored in the first multi-bit cell is "11". When the distribution state generated in the second multi-bit cell corresponds the third threshold voltage state, the data stored in the second multi-bit cell is "01".

Figure 3:
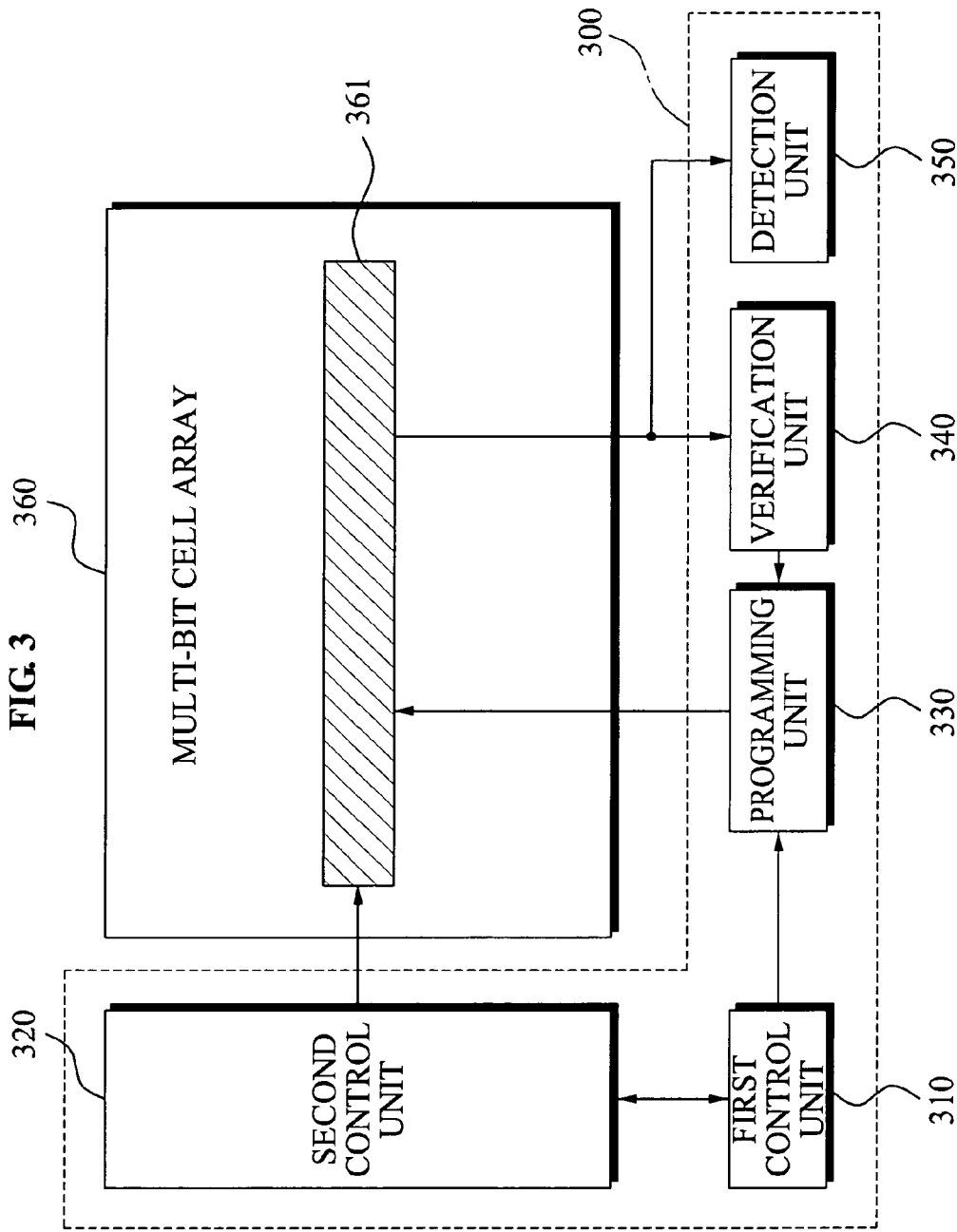
FIG. 3 is a diagram illustrating a multi-bit programming apparatus according to another example embodiment.

FIG. 3 is a diagram illustrating a multi-bit programming apparatus 300 according to another example embodiment.

Referring to FIG. 3, the multi-bit programming apparatus 300 programs N×M-bit data in a page 361 of a multi-bit cell array 360.

The page 361 includes simultaneously-programmed 'M' multi-bit cells.

The multi-bit programming apparatus 300 may include a first control unit 310, a second control unit 320, a programming unit 330, a verification unit 340, and a detection unit 350.

The first control unit 310 allocates any one of $2^N$ threshold voltage states to the N-bit data.

The second control unit 320 spaces, by any one of a first interval and a second interval, adjacent threshold voltage states of the $2^N$ threshold voltage states.

The programming unit 330 generates, in each of the multi-bit cells of the page 361, a distribution state corresponding to the allocated threshold voltage state. When the distribution state is generated in each of the multi-bit cells, each of the multi-bit cells may be regarded as storing the data corresponding to the threshold voltage state.

The verification unit 340 measures a threshold voltage of each of the multi-bit cells of the page 361. The verification unit 340 compares the measured threshold voltage of each of the multi-bit cells and a verification voltage. The verification unit 340 verifies whether the distribution state corresponding to the allocated threshold voltage state is generated in each of the multi-bit cells based on a comparison result.

In example embodiments, the verification voltage corresponds to the allocated threshold voltage state.

Each of the $2^N$ threshold voltage states has the verification voltage corresponding to each of the $2^N$ threshold voltage states.

According to example embodiments, the verification unit 340 may feed back a verification result to the programming unit 330, and the programming unit 330 may determine whether to additionally perform programming of each of the multi-bit cells based on the fed-back verification result.

In the present example embodiment, a case where the programming increases the threshold voltage of each of the multi-bit cells is assumed.

When the measured threshold voltage of each of the multi-bit cells is lower than the verification voltage, the verification unit 340 determines that the distribution state corresponding to the allocated threshold voltage state is not generated in each of the multi-bit cells. The verification unit 340 feeds back, to the programming unit 330, a determination result of the multi-bit cells in which the distribution state is not generated.

The programming unit 330 continuously performs the programming of the multi-bit cells to which the determination result that the distribution state is not generated is fed back. The threshold voltage of the multi-bit cells additionally programmed by the programming unit 330 increases.

The programming unit 330 may perform the programming during a predetermined time via a unit programming operation.

The verification unit 340 compares the measured threshold voltage of each of the multi-bit cells and the verification voltage after the first unit programming operation is completed. The verification unit 340 feeds back, to the programming unit 330, a comparison result of the multi-bit cells in which the measured threshold voltage is lower than the verification voltage.

The programming unit 330 performs the second unit programming operation of the multi-bit cells corresponding to the fed-back comparison result.

Using the above-described method, the programming unit 330 performs the unit programming operation until the distribution state corresponding to the allocated threshold voltage state is generated in all the multi-bit cells in the page 361.

The second control unit 320 adjusts the distribution states generated by the programming unit 330 by adjusting the verification voltage. In example embodiments, the second control unit 320 may adjust an interval between the threshold voltage states by adjusting an interval between the verification voltages.

The detection unit 350 compares a threshold voltage of the multi-bit cell and a detection voltage. The detection unit 350 determines which threshold voltage state includes the threshold voltage of the multi-bit cell based on a comparison result with the detection voltage.

The multi-bit programming apparatus 300 determines whether the threshold voltage state of each multi-bit cell, the threshold voltage state being detected by the detection unit 350, corresponds to the data programmed in each multi-bit cell.

When the detected threshold voltage state and the data are frequently different from specific threshold voltage states, the second control unit 320 may adjust the verification voltages to increase a distance between the specific threshold voltage states.

A case where the first threshold voltage state corresponds to data "10" and the second threshold voltage state corresponds to data "01" is assumed.

When data "10" is programmed in the first multi-bit cell, and data "01" is programmed in the second multi-bit cell, the detection unit 350 determines whether the threshold voltage of the first multi-bit cell is included in the first threshold voltage state.

Similarly, the detection unit 350 determines whether the threshold voltage of the second multi-bit cell is included in the second threshold voltage state.

When a distance between the first threshold voltage state and the second threshold voltage state is very small, the threshold voltage of the first multi-bit cell detected by the detection unit 350 may be the second threshold voltage state. In example embodiments, the multi-bit programming apparatus 300 may record that a data determination error is generated between the first threshold voltage state and the second threshold voltage state.

The multi-bit programming apparatus 300 may generate statistics of the data determination error by collecting information about the data determination errors.

The second control unit 320 may adjust the verification voltages based on the generated statistics of the data determination error.

Figure 2:
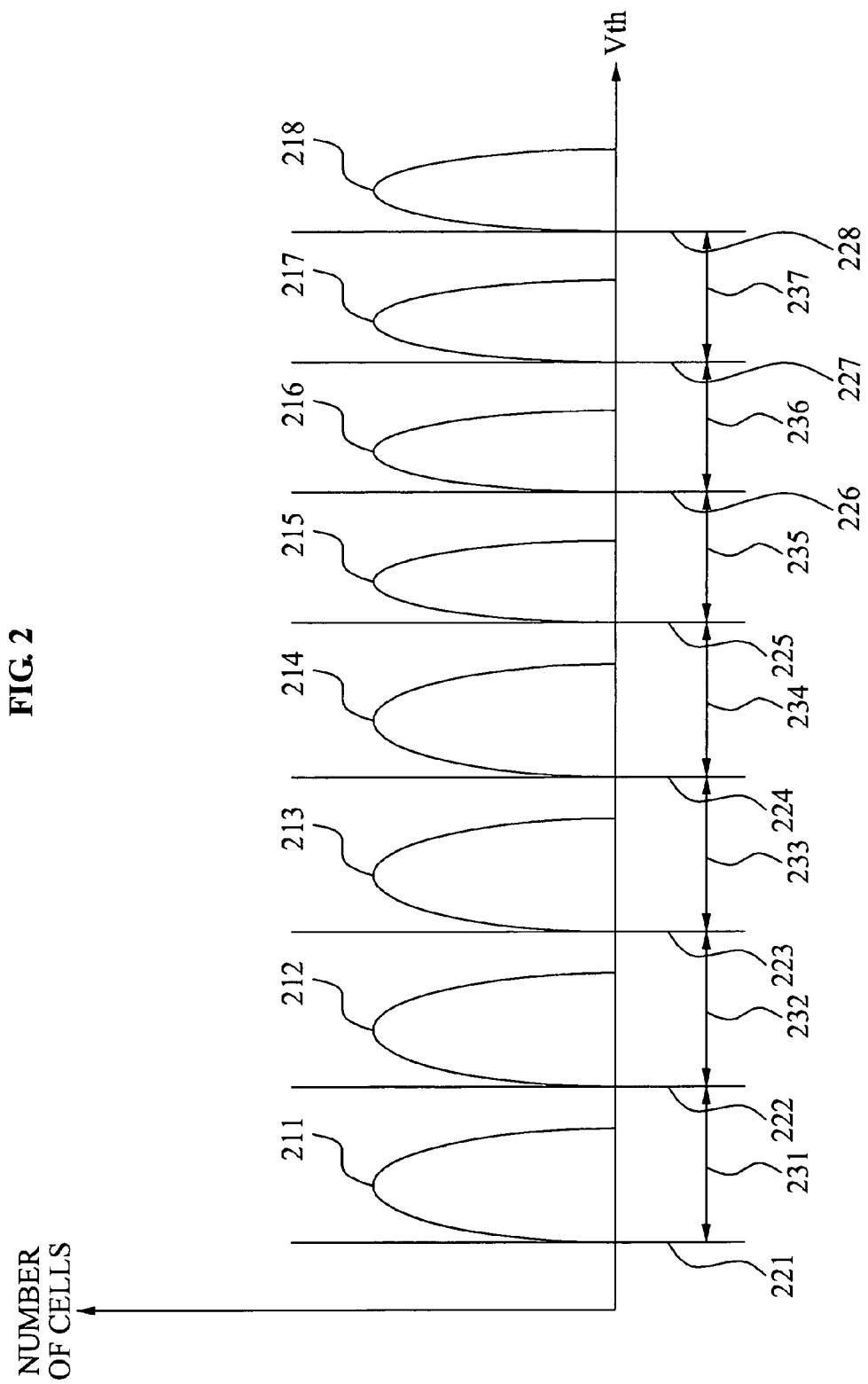
FIG. 2 is a graph illustrating an example of a distribution of threshold voltages of multi-bit cells in a multi-bit cell array generated by a multi-bit programming apparatus of FIG. 3.

FIG. 2 is a graph illustrating an example of a distribution of threshold voltages of multi-bit cells in the multi-bit cell 360 array generated by the multi-bit programming apparatus 300 of FIG. 3.

Referring to FIG. 2, a horizontal axis of FIG. 2 denotes threshold voltages, and a vertical axis of FIG. 2 denotes a number of multi-bit cells having the threshold voltages.

The first control unit 310 allocates the first threshold voltage state to data "111", allocates the second threshold voltage state to data "110", allocates the third threshold voltage state to data "101", and allocates the fourth threshold voltage state to data "100".

The first control unit 310 allocates the fifth threshold voltage state to data "011", allocates the sixth threshold voltage state to data "010", allocates the seventh threshold voltage state to data "001", and allocates the eighth threshold voltage state to data "000".

The second control unit 320 allocates a voltage level 221 as the verification voltage to the first threshold voltage state, allocates a voltage level 222 as the verification voltage to the second threshold voltage state, allocates a voltage level 223 as the verification voltage to the third threshold voltage state, and allocates a voltage level 224 as the verification voltage to the fourth threshold voltage state.

The second control unit 320 allocates a voltage level 225 as the verification voltage to the fifth threshold voltage state, allocates a voltage level 226 as the verification voltage to the sixth threshold voltage state, allocates a voltage level 227 as the verification voltage to the seventh threshold voltage state, and allocates a voltage level 228 as the verification voltage to the eighth threshold voltage state.

The programming unit 330 and the verification unit 340 perform programming so that the threshold voltage of the multi-bit cells in which data "111" is programmed may be higher than the voltage level 221. The programming unit 330 and the verification unit 340 perform the programming so that the multi-bit cells in which data "111" is programmed may generate a distribution state 211.

The programming unit 330 and the verification unit 340 perform programming so that the threshold voltage of the multi-bit cells in which data "110" is programmed may be higher than the voltage level 222. The programming unit 330 and the verification unit 340 perform the programming so that the multi-bit cells in which data "110" is programmed may generate a distribution state 212.

The programming unit 330 and the verification unit 340 perform programming so that the threshold voltage of the multi-bit cells in which data "101" is programmed may be higher than the voltage level 223. The programming unit 330 and the verification unit 340 perform the programming so that the multi-bit cells in which data "101" is programmed may generate a distribution state 213.

The programming unit 330 and the verification unit 340 perform programming so that the threshold voltage of the multi-bit cells in which data "100" is programmed may be higher than the voltage level 224. The programming unit 330 and the verification unit 340 perform the programming so that the multi-bit cells in which data "100" is programmed may generate a distribution state 214.

The programming unit 330 and the verification unit 340 perform programming so that the threshold voltage of the multi-bit cells in which data "011" is programmed may be higher than the voltage level 225. The programming unit 330 and the verification unit 340 perform the programming so that the multi-bit cells in which data "011" is programmed may generate a distribution state 215.

The programming unit 330 and the verification unit 340 perform programming so that the threshold voltage of the multi-bit cells in which data "010" is programmed may be higher than the voltage level 226. The programming unit 330 and the verification unit 340 perform the programming so that the multi-bit cells in which data "010" is programmed may generate a distribution state 216.

The programming unit 330 and the verification unit 340 perform programming so that the threshold voltage of the multi-bit cells in which data "001" is programmed may be higher than the voltage level 227. The programming unit 330 and the verification unit 340 perform the programming so that the multi-bit cells in which data "001" is programmed may generate a distribution state 217.

The programming unit 330 and the verification unit 340 perform programming so that the threshold voltage of the multi-bit cells in which data "000" is programmed may be higher than the voltage level 228. The programming unit 330 and the verification unit 340 perform the programming so that the multi-bit cells in which data "000" is programmed may generate a distribution state 218.

Generally, since characteristics of each multi-bit cell are different from each other, the threshold voltage of the programmed multi-bit cells generates a distribution having some deviation from a center value as illustrated in FIG. 2.

A mechanism including a difference of the characteristics of each multi-bit cell, floating polysilicon (FP) coupling, and the like may affect spreading the distribution of the threshold voltages of the multi-bit cells.

The FP coupling denotes a phenomenon that a threshold voltage of a center multi-bit cell is affected by a programming process of surrounding multi-bit cells. The threshold voltage of the center multi-bit cell is affected by coupling of a parasitic capacitance between FPs of the multi-bit cells.

When the programming process increases the threshold voltage, the threshold voltage of the center multi-bit cell becomes higher than a desired value by the FP coupling.

The distribution of the threshold voltage of the multi-bit cells has a spread tendency due to mechanisms such as the FP coupling. A fact that a change of the threshold voltage due to the FP coupling is great when the threshold voltage is low is well-known.

Since a voltage window in which the multi-bit cell is operated is limited, a possibility that the distribution of the threshold voltage overlaps increases as the distribution of the threshold voltage spreads. As an overlapping degree of the distribution of the threshold voltage increases, an error rate of inaccurately reading the programmed data increases.

According to example embodiments, the second control unit 320 may select threshold voltage states of the threshold voltage states as a first threshold voltage state group, the selected threshold voltage states having a voltage higher than a reference voltage, and may select remaining threshold voltage states as a second threshold voltage state group.

The second control unit 320 may space, by the first interval, the adjacent threshold voltage states of the selected first threshold voltage state group, and may space, by the second interval, the adjacent threshold voltage states of the selected second threshold voltage state group.

For example, the second control unit 320 may select the voltage level 225 as the reference voltage. The second control unit 320 may select the threshold voltage states corresponding to the distribution states 211, 212, 213, and 214, that is, the first threshold voltage state to the fourth threshold voltage state as the first threshold voltage state group.

The second control unit 320 may apply the first interval to the threshold voltage states of the first threshold voltage state group. As a result of the application, a distance between the distribution state 211 and the distribution state 212 generated by the programming unit 330 corresponds to the first interval.

The second control unit 320 may apply the second interval to the threshold voltage states of the second threshold voltage state group. As a result of the application, a distance between the distribution state 216 and the distribution state 217 generated by the programming unit 330 corresponds to the second interval.

According to example embodiments, the second control unit 320 may perform an adjustment to increase the interval between the threshold voltage states as the threshold voltage of the threshold voltage states decreases. In this case, different $2^N-1$ intervals of the $2^N$ threshold voltage states may exist.

According to example embodiments, the second control unit 320 may perform an adjustment to increase the interval between the threshold voltage states as the threshold voltage of the threshold voltage states decreases, and may apply the fixed interval to the threshold voltage states having the threshold voltage higher than the reference voltage.

As described above, since a great effect of the FP coupling is shown in the low threshold voltage, the distribution states having the low threshold voltage may have a form being more spread than the distribution states having the high threshold voltage as illustrated in FIG. 2.

The second control unit 320 provides a programming method adaptively corresponding to the distribution states being spread by the FP coupling by adjusting the verification voltages.

According to example embodiments, the programming unit 330 may program the N-bit data in the multi-bit cells of the page 361 by performing 'N' page programming operations.

In example embodiments, each of 'N' page programming operations may be related to any one of the first interval and the second interval.

Each of page programming operations may include a plurality of unit programming operations.

Figure 4:
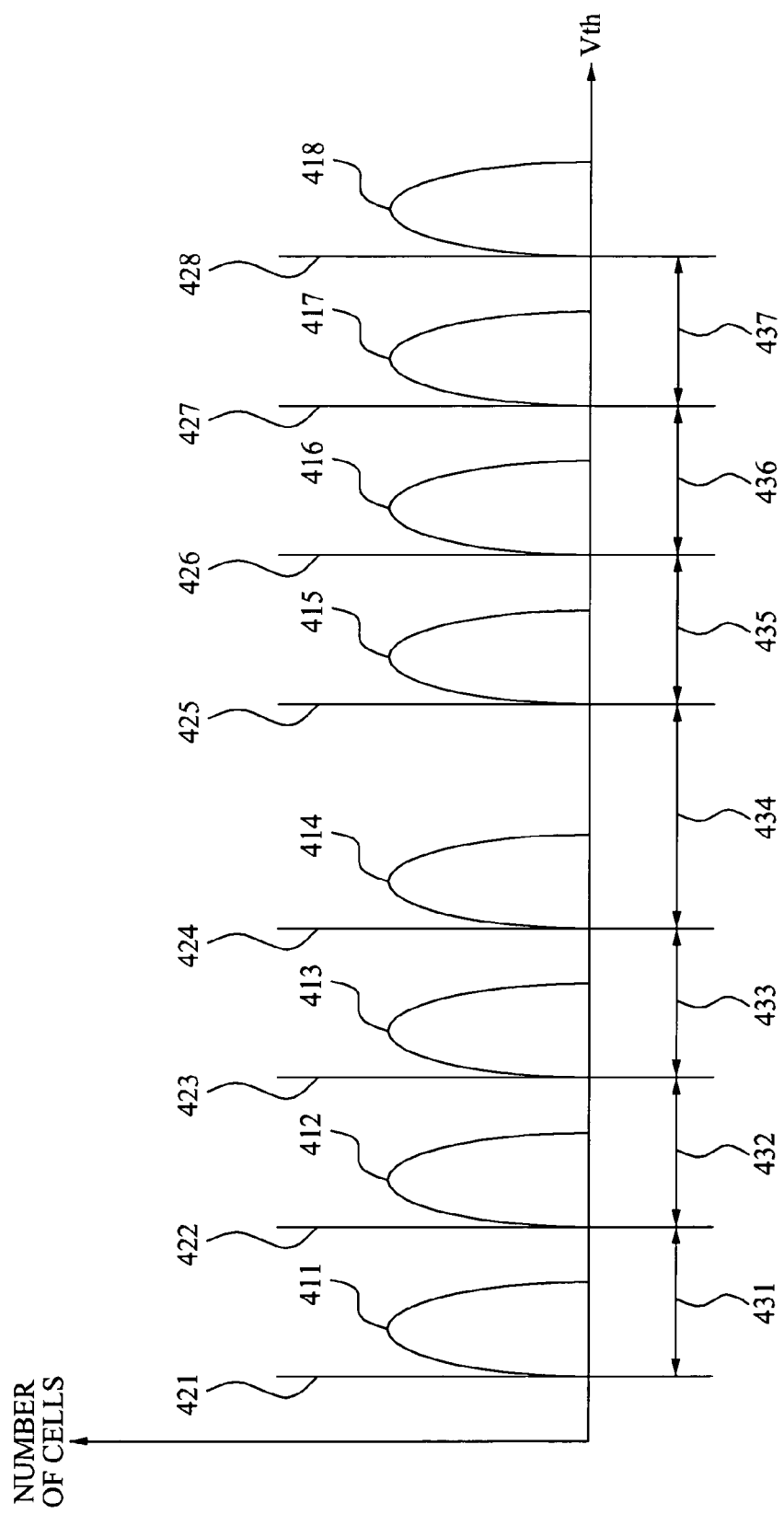
FIG. 4 is a graph illustrating another example of the distribution of the threshold voltages of the multi-bit cells in the multi-bit cell array generated by the multi-bit programming apparatus of FIG. 3.

FIG. 4 is a graph illustrating another example of the distribution of the threshold voltages of the multi-bit cells in the multi-bit cell array 360 generated by the multi-bit programming apparatus 300 of FIG. 3.

Referring to FIG. 4, a horizontal axis of FIG. 4 denotes threshold voltages and a vertical axis of FIG. 4 denotes a number of multi-bit cells having the threshold voltages.

The first control unit 310 allocates the first threshold voltage state to data "111", allocates the second threshold voltage state to data "110", allocates the third threshold voltage state to data "100", and allocates the fourth threshold voltage state to data "101".

The first control unit 310 allocates the fifth threshold voltage state to data "001", allocates the sixth threshold voltage state to data "000", allocates the seventh threshold voltage state to data "010", and allocates the eighth threshold voltage state to data "011".

The second control unit 320 allocates a voltage level 421 as the verification voltage to the first threshold voltage state, allocates a voltage level 422 as the verification voltage to the second threshold voltage state, allocates a voltage level 423 as the verification voltage to the third threshold voltage state, and allocates a voltage level 424 as the verification voltage to the fourth threshold voltage state.

The second control unit 320 allocates a voltage level 425 as the verification voltage to the fifth threshold voltage state, allocates a voltage level 426 as the verification voltage to the sixth threshold voltage state, allocates a voltage level 427 as the verification voltage to the seventh threshold voltage state, and allocates a voltage level 428 as the verification voltage to the eighth threshold voltage state.

The programming unit 330 and the verification unit 340 perform programming so that the threshold voltage of the multi-bit cells in which data "111" is programmed may be higher than the voltage level 421. The programming unit 330 and the verification unit 340 perform the programming so that the multi-bit cells in which data "111" is programmed may generate a distribution state 411.

The programming unit 330 and the verification unit 340 perform programming so that the threshold voltage of the multi-bit cells in which data "110" is programmed may be higher than the voltage level 422. The programming unit 330 and the verification unit 340 perform the programming so that the multi-bit cells in which data "110" is programmed may generate a distribution state 412.

The programming unit 330 and the verification unit 340 perform programming so that the threshold voltage of the multi-bit cells in which data "100" is programmed may be higher than the voltage level 423. The programming unit 330 and the verification unit 340 perform the programming so that the multi-bit cells in which data "100" is programmed may generate a distribution state 413.

The programming unit 330 and the verification unit 340 perform programming so that the threshold voltage of the multi-bit cells in which data "101" is programmed may be higher than the voltage level 424. The programming unit 330 and the verification unit 340 perform the programming so that the multi-bit cells in which data "101" is programmed may generate a distribution state 414.

The programming unit 330 and the verification unit 340 perform programming so that the threshold voltage of the multi-bit cells in which data "001" is programmed may be higher than the voltage level 425. The programming unit 330 and the verification unit 340 perform the programming so that the multi-bit cells in which data "001" is programmed may generate a distribution state 415.

The programming unit 330 and the verification unit 340 perform programming so that the threshold voltage of the multi-bit cells in which data "000" is programmed may be higher than the voltage level 426. The programming unit 330 and the verification unit 340 perform the programming so that the multi-bit cells in which data "000" is programmed may generate a distribution state 416.

The programming unit 330 and the verification unit 340 perform programming so that the threshold voltage of the multi-bit cells in which data "010" is programmed may be higher than the voltage level 427. The programming unit 330 and the verification unit 340 perform the programming so that the multi-bit cells in which data "010" is programmed may generate a distribution state 417.

The programming unit 330 and the verification unit 340 perform programming so that the threshold voltage of the multi-bit cells in which data "011" is programmed may be higher than the voltage level 428. The programming unit 330 and the verification unit 340 perform the programming so that the multi-bit cells in which data "011" is programmed may generate a distribution state 418.

The first control unit 310 allocates the first threshold voltage state to the fourth threshold voltage state to page data "1" of the first page programming operation, and allocates the fifth threshold voltage state to the eighth threshold voltage state to page data "0".

The first control unit 310 allocates the first threshold voltage state, the second threshold voltage state, the seventh threshold voltage state, and the eighth threshold voltage state to page data "1" of the second page programming operation.

The first control unit 310 allocates the first threshold voltage state, the fourth threshold voltage state, the fifth threshold voltage state, and the eighth threshold voltage state to page data "1" of the third page programming operation.

The second control unit 320 adjusts the threshold voltage states corresponding to a section of changing the page data of each page programming operation from "1" to "0" or from "0" to "1" using any one of the first interval and the second interval.

The present example embodiment applies the first interval to the section in which the page data of the first page programming operation is changed, and applies the second interval to the section in which the page data of the second page programming operation and the third page programming operation are changed.

Referring to FIG. 4, a distance between the distribution state 414 and the distribution state 415 is illustrated being longer than other intervals.

Since the section in which the page data of the first page programming operation is changed is a section between the fourth threshold voltage state and the fifth threshold voltage state, the distance between the distribution state 414 and the distribution state 415 generated by the programming unit 330 is adjusted to be longer than the other intervals.

According to the present example embodiment, when an error rate in reading the page data of the first page programming operation is high, the error rate of the multi-bit cell array 360 may be reduced.

Figure 5:
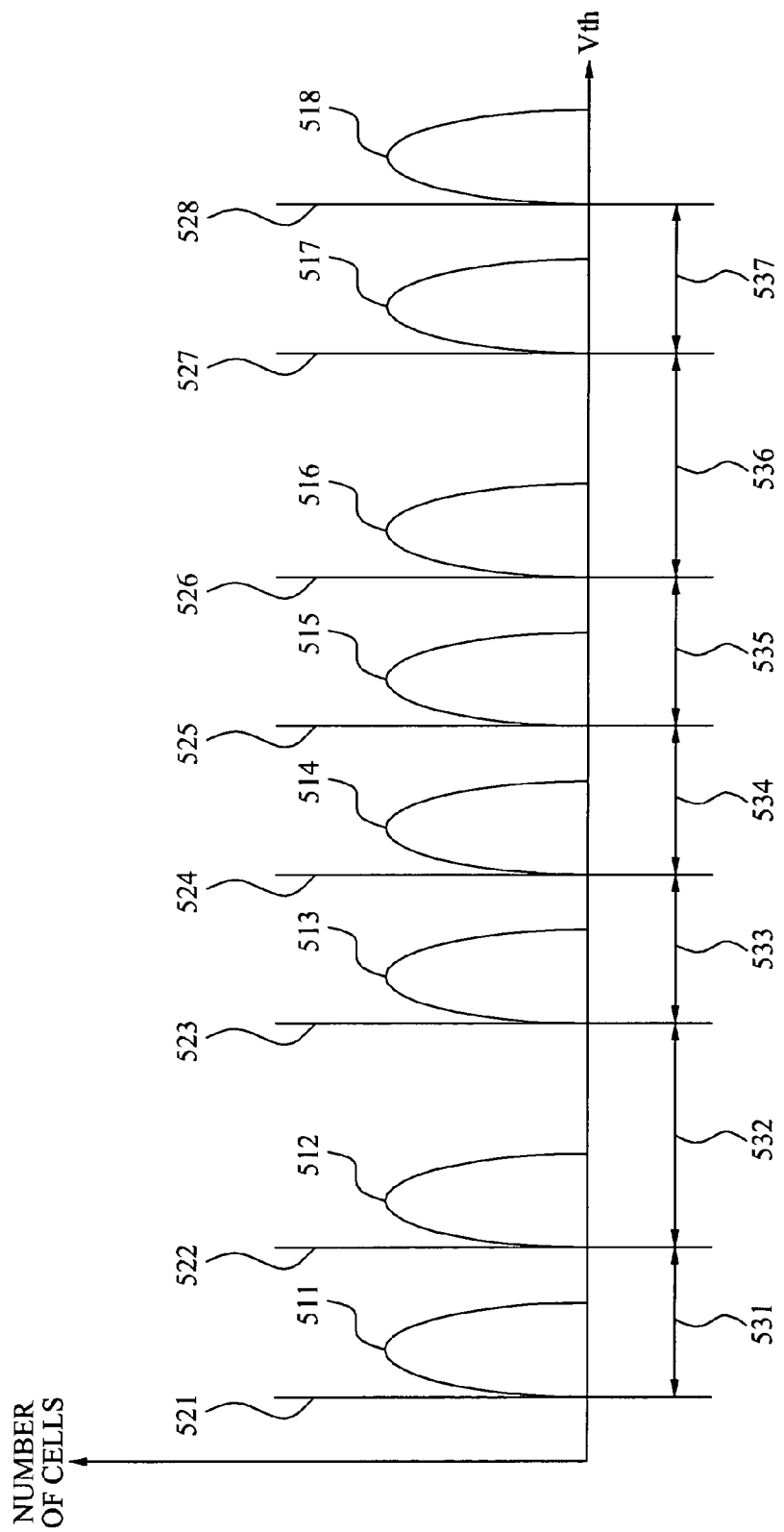
FIG. 5 is a graph illustrating still another example of the distribution of the threshold voltages of the multi-bit cells in the multi-bit cell array generated by the multi-bit programming apparatus of FIG. 3.

FIG. 5 is a graph illustrating still another example of the distribution of the threshold voltages of the multi-bit cells in the multi-bit cell array 360 generated by the multi-bit programming apparatus 300 of FIG. 3.

Referring to FIG. 5, a horizontal axis of FIG. 5 denotes threshold voltages and a vertical axis of FIG. 5 denotes a number of multi-bit cells having the threshold voltages.

The first control unit 310 allocates the first threshold voltage state to data "111", allocates the second threshold voltage state to data "110", allocates the third threshold voltage state to data "100", and allocates the fourth threshold voltage state to data "101".

The first control unit 310 allocates the fifth threshold voltage state to data "001", allocates the sixth threshold voltage state to data "000", allocates the seventh threshold voltage state to data "010", and allocates the eighth threshold voltage state to data "011".

The second control unit 320 allocates a voltage level 521 as the verification voltage to the first threshold voltage state, allocates a voltage level 522 as the verification voltage to the second threshold voltage state, allocates a voltage level 523 as the verification voltage to the third threshold voltage state, and allocates a voltage level 524 as the verification voltage to the fourth threshold voltage state.

The second control unit 320 allocates a voltage level 525 as the verification voltage to the fifth threshold voltage state, allocates a voltage level 526 as the verification voltage to the sixth threshold voltage state, allocates a voltage level 527 as the verification voltage to the seventh threshold voltage state, and allocates a voltage level 528 as the verification voltage to the eighth threshold voltage state.

The programming unit 330 and the verification unit 340 perform programming so that the threshold voltage of the multi-bit cells in which data "111" is programmed may be higher than the voltage level 521. The programming unit 330 and the verification unit 340 perform the programming so that the multi-bit cells in which data "111" is programmed may generate a distribution state 511.

The programming unit 330 and the verification unit 340 perform programming so that the threshold voltage of the multi-bit cells in which data "110" is programmed may be higher than the voltage level 522. The programming unit 330 and the verification unit 340 perform the programming so that the multi-bit cells in which data "110" is programmed may generate a distribution state 512.

The programming unit 330 and the verification unit 340 perform programming so that the threshold voltage of the multi-bit cells in which data "100" is programmed may be higher than the voltage level 523. The programming unit 330 and the verification unit 340 perform the programming so that the multi-bit cells in which data "100" is programmed may generate a distribution state 513.

The programming unit 330 and the verification unit 340 perform programming so that the threshold voltage of the multi-bit cells in which data "101" is programmed may be higher than the voltage level 524. The programming unit 330 and the verification unit 340 perform the programming so that the multi-bit cells in which data "101" is programmed may generate a distribution state 514.

The programming unit 330 and the verification unit 340 perform programming so that the threshold voltage of the multi-bit cells in which data "001" is programmed may be higher than the voltage level 525. The programming unit 330 and the verification unit 340 perform the programming so that the multi-bit cells in which data "001" is programmed may generate a distribution state 515.

The programming unit 330 and the verification unit 340 perform programming so that the threshold voltage of the multi-bit cells in which data "000" is programmed may be higher than the voltage level 526. The programming unit 330 and the verification unit 340 perform the programming so that the multi-bit cells in which data "000" is programmed may generate a distribution state 516.

The programming unit 330 and the verification unit 340 perform programming so that the threshold voltage of the multi-bit cells in which data "010" is programmed may be higher than the voltage level 527. The programming unit 330 and the verification unit 340 perform the programming so that the multi-bit cells in which data "010" is programmed may generate a distribution state 517.

The programming unit 330 and the verification unit 340 perform programming so that the threshold voltage of the multi-bit cells in which data "011" is programmed may be higher than the voltage level 528. The programming unit 330 and the verification unit 340 perform the programming so that the multi-bit cells in which data "011" is programmed may generate a distribution state 518.

The first control unit 310 allocates the first threshold voltage state to the fourth threshold voltage state to page data "1" of the first page programming operation, and allocates the fifth threshold voltage state to the eighth threshold voltage state to page data "0".

The first control unit 310 allocates the first threshold voltage state, the second threshold voltage state, the seventh threshold voltage state, and the eighth threshold voltage state to page data "1" of the second page programming operation.

The first control unit 310 allocates the first threshold voltage state, the fourth threshold voltage state, the fifth threshold voltage state, and the eighth threshold voltage state to page data "1" of the third page programming operation.

The second control unit 320 adjusts the threshold voltage states corresponding to a section of changing the page data of each page programming operation from "1" to "0" or from "0" to "1" using any one of the first interval and the second interval.

The present example embodiment applies the first interval to the section in which the page data of the second page programming operation is changed, and applies the second interval to the section in which the page data of the first page programming operation and the third page programming operation are changed.

Referring to FIG. 5, a distance between the distribution state 512 and the distribution state 513, and a distance between the distribution state 516 and the distribution state 517 are illustrated being longer than other intervals.

Since the sections in which the page data of the second page programming operation is changed are a section between the second threshold voltage state and the third threshold voltage state, and a section between the sixth threshold voltage state and the seventh threshold voltage state, the distance between the distribution state 512 and the distribution state 513, and the distance between the distribution state 516 and the distribution state 517 generated by the programming unit 330 are adjusted to be longer than the other intervals.

According to the present example embodiment, when an error rate in reading the page data of the second page programming operation is high, the error rate of the multi-bit cell array 360 may be reduced.

Figure 6:
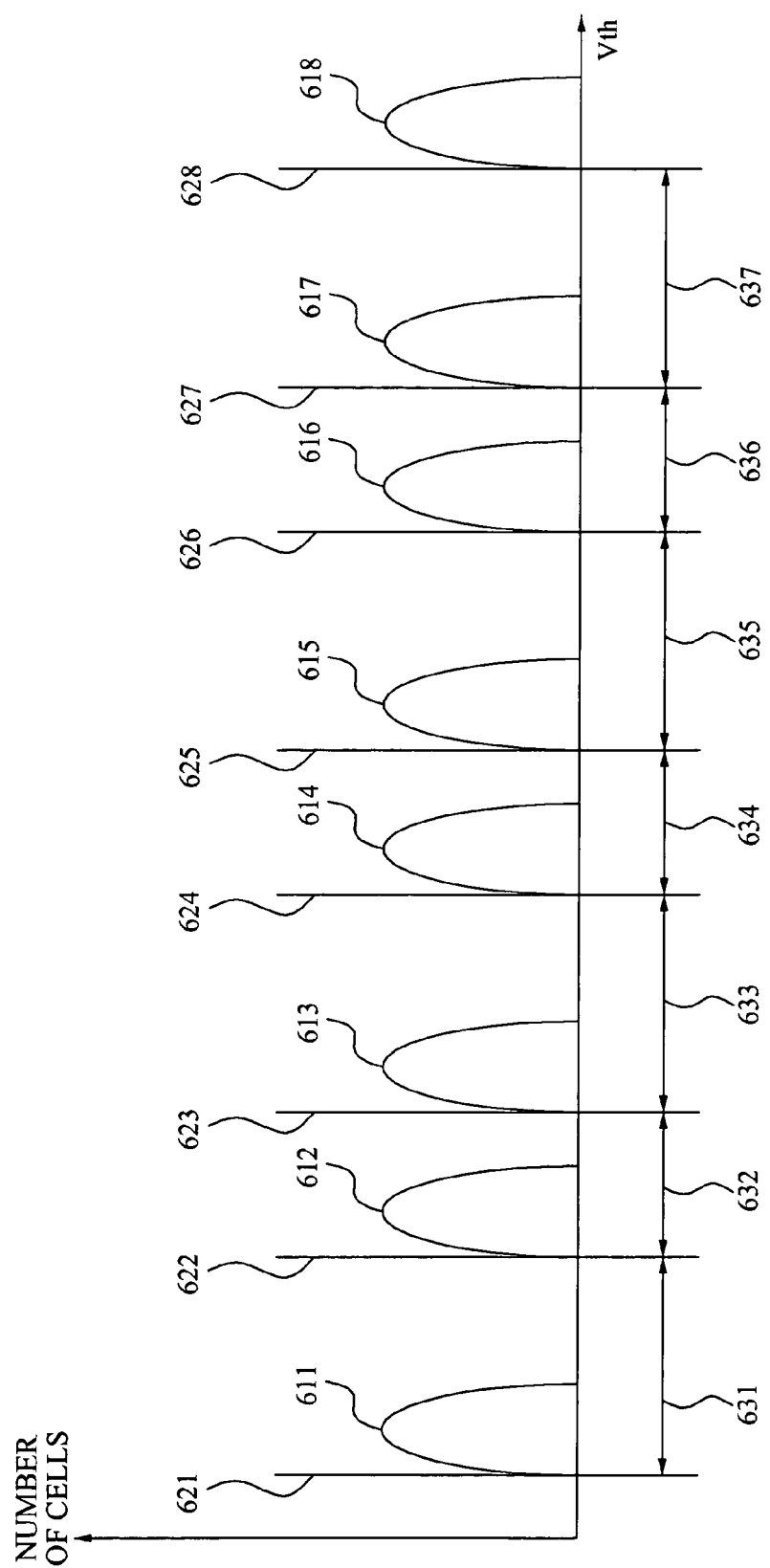
FIG. 6 is a graph illustrating yet another example of the distribution of the threshold voltages of the multi-bit cells in the multi-bit cell array generated by the multi-bit programming apparatus of FIG. 3.

FIG. 6 is a graph illustrating yet another example of the distribution of the threshold voltages of the multi-bit cells in the multi-bit cell array 360 generated by the multi-bit programming apparatus 300 of FIG. 3.

Referring to FIG. 6, a horizontal axis of FIG. 6 denotes threshold voltages and a vertical axis of FIG. 6 denotes a number of multi-bit cells having the threshold voltages.

The first control unit 310 allocates the first threshold voltage state to data "111", allocates the second threshold voltage state to data "110", allocates the third threshold voltage state to data "100", and allocates the fourth threshold voltage state to data "101".

The first control unit 310 allocates the fifth threshold voltage state to data "001", allocates the sixth threshold voltage state to data "000", allocates the seventh threshold voltage state to data "010", and allocates the eighth threshold voltage state to data "011".

The second control unit 320 allocates a voltage level 621 as the verification voltage to the first threshold voltage state, allocates a voltage level 622 as the verification voltage to the second threshold voltage state, allocates a voltage level 623 as the verification voltage to the third threshold voltage state, and allocates a voltage level 624 as the verification voltage to the fourth threshold voltage state.

The second control unit 320 allocates a voltage level 625 as the verification voltage to the fifth threshold voltage state, allocates a voltage level 626 as the verification voltage to the sixth threshold voltage state, allocates a voltage level 627 as the verification voltage to the seventh threshold voltage state, and allocates a voltage level 628 as the verification voltage to the eighth threshold voltage state.

The programming unit 330 and the verification unit 340 perform programming so that the threshold voltage of the multi-bit cells in which data "111" is programmed may be higher than the voltage level 621. The programming unit 330 and the verification unit 340 perform the programming so that the multi-bit cells in which data "111" is programmed may generate a distribution state 611.

The programming unit 330 and the verification unit 340 perform programming so that the threshold voltage of the multi-bit cells in which data "110" is programmed may be higher than the voltage level 622. The programming unit 330 and the verification unit 340 perform the programming so that the multi-bit cells in which data "110" is programmed may generate a distribution state 612.

The programming unit 330 and the verification unit 340 perform programming so that the threshold voltage of the multi-bit cells in which data "100" is programmed may be higher than the voltage level 623. The programming unit 330 and the verification unit 340 perform the programming so that the multi-bit cells in which data "100" is programmed may generate a distribution state 613.

The programming unit 330 and the verification unit 340 perform programming so that the threshold voltage of the multi-bit cells in which data "101" is programmed may be higher than the voltage level 624. The programming unit 330 and the verification unit 340 perform the programming so that the multi-bit cells in which data "101" is programmed may generate a distribution state 614.

The programming unit 330 and the verification unit 340 perform programming so that the threshold voltage of the multi-bit cells in which data "001" is programmed may be higher than the voltage level 625. The programming unit 330 and the verification unit 340 perform the programming so that the multi-bit cells in which data "001" is programmed may generate a distribution state 615.

The programming unit 330 and the verification unit 340 perform programming so that the threshold voltage of the multi-bit cells in which data "000" is programmed may be higher than the voltage level 626. The programming unit 330 and the verification unit 340 perform the programming so that the multi-bit cells in which data "000" is programmed may generate a distribution state 616.

The programming unit 330 and the verification unit 340 perform programming so that the threshold voltage of the multi-bit cells in which data "010" is programmed may be higher than the voltage level 627. The programming unit 330 and the verification unit 340 perform the programming so that the multi-bit cells in which data "010" is programmed may generate a distribution state 617.

The programming unit 330 and the verification unit 340 perform programming so that the threshold voltage of the multi-bit cells in which data "011" is programmed may be higher than the voltage level 628. The programming unit 330 and the verification unit 340 perform the programming so that the multi-bit cells in which data "011" is programmed may generate a distribution state 618.

The first control unit 310 allocates the first threshold voltage state to the fourth threshold voltage state to page data "1" of the first page programming operation, and allocates the fifth threshold voltage state to the eighth threshold voltage state to page data "0".

The first control unit 310 allocates the first threshold voltage state, the second threshold voltage state, the seventh threshold voltage state, and the eighth threshold voltage state to page data "1" of the second page programming operation.

The first control unit 310 allocates the first threshold voltage state, the fourth threshold voltage state, the fifth threshold voltage state, and the eighth threshold voltage state to page data "1" of the third page programming operation.

The second control unit 320 adjusts the threshold voltage states corresponding to a section of changing the page data of each page programming operation from "1" to "0" or from "0" to "1" using any one of the first interval and the second interval.

The present example embodiment applies the first interval to the section in which the page data of the third page programming operation is changed, and applies the second interval to the section in which the page data of the first page programming operation and the second page programming operation are changed.

Referring to FIG. 6, a distance between the distribution state 611 and the distribution state 612, a distance between the distribution state 613 and the distribution state 614, a distance between the distribution state 615 and the distribution state 616, and a distance between the distribution state 617 and the distribution state 618 are illustrated being longer than other intervals.

The sections in which the page data of the third page programming operation is changed are a section between the first threshold voltage state and the second threshold voltage state, a section between the third threshold voltage state and the fourth threshold voltage state, a section between the fifth threshold voltage state and the sixth threshold voltage state, and a section between the seventh threshold voltage state and the eighth threshold voltage state.

Accordingly, the distance between the distribution state 611 and the distribution state 612, the distance between the distribution state 613 and the distribution state 614, the distance between the distribution state 615 and the distribution state 616, and the distance between the distribution state 617 and the distribution state 618 generated by the programming unit 330 are adjusted to be longer than the other intervals.

According to the present example embodiment, when an error rate in reading the page data of the third page programming operation is high, the error rate of the multi-bit cell array 360 may be reduced.

Generally, error correction codes (ECC) are used to prepare for a possibility that an error is generated while reading data stored in a memory device (or storing the data). The ECC are referred to as error control codes being a wide concept.

An encoding or decoding process via the ECC is performed for each page unit. According to the present example embodiment, when the error rate in reading the page data of the third page programming operation is higher than an error correcting capability of an ECC decoder, the multi-bit programming apparatus 300 performs an adjustment to increase the interval between the threshold voltage states corresponding to the third page programming operation.

Figure 7:
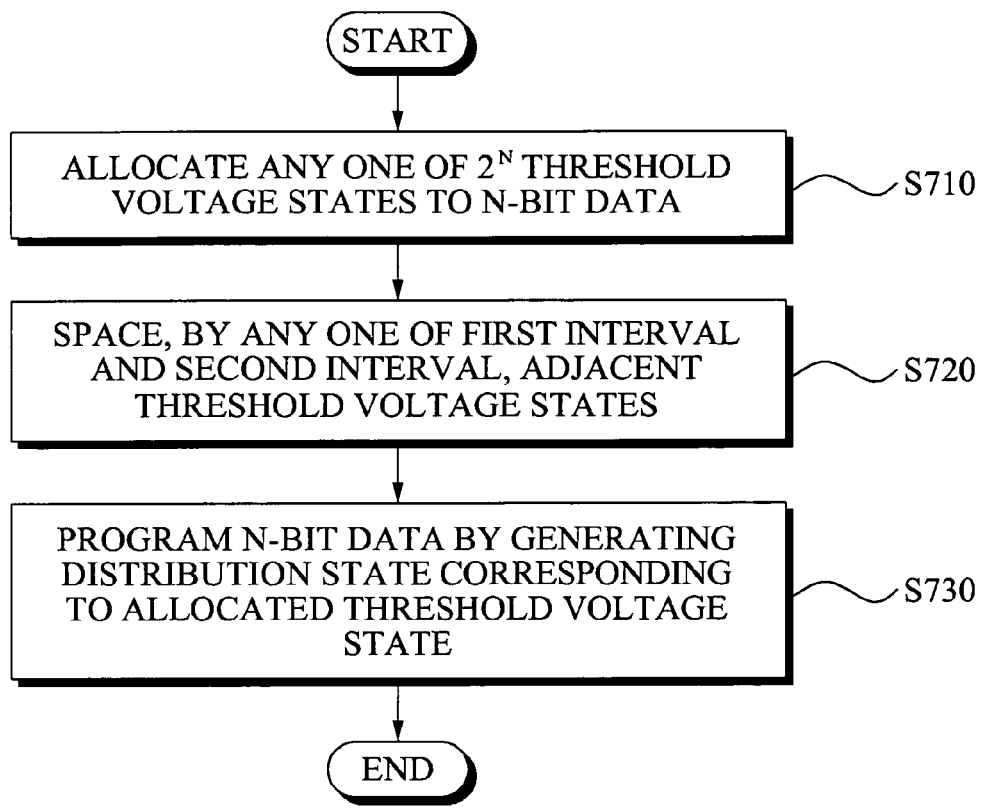
FIG. 7 is a flowchart illustrating a multi-bit programming method according to an example embodiment.

FIG. 7 is a flowchart illustrating a multi-bit programming method according to an example embodiment.

The multi-bit programming method programs N-bit data in at least one multi-bit cell.

Referring to FIG. 7, in operation S710, the multi-bit programming method allocates any one of $2^N$ threshold voltage states to the N-bit data.

In operation S720, the multi-bit programming method spaces, by any one of a first interval and a second interval, adjacent threshold voltage states.

In operation S730, the multi-bit programming method generates, in each of the at least one multi-bit cell, a distribution state corresponding to the allocated threshold voltage state.

In operation S730, the multi-bit programming method programs the N-bit data in each of the at least one multi-bit cell by generating, in each of the at least one multi-bit cell, a distribution state corresponding to the allocated threshold voltage state.

The multi-bit programming method may verify whether the distribution state corresponding to the allocated threshold voltage state is generated by comparing a threshold voltage of the at least one multi-bit cell and a verification voltage.

In operation S720, the multi-bit programming method spaces, by any one of the first interval and the second interval, the adjacent threshold voltage states by adjusting the verification voltage.

The multi-bit programming method may select threshold voltage states of the threshold voltage states as a first threshold voltage state group, the selected threshold voltage states having a threshold voltage higher than a reference voltage.

In example embodiments, in operation S720, the multi-bit programming method spaces, by the first interval, the adjacent threshold voltage states of the first threshold voltage state group.

The multi-bit programming method may detect a threshold voltage state of the at least one multi-bit cell by comparing a threshold voltage of the at least one multi-bit cell and a detection voltage.

In example embodiments, the multi-bit programming method may generate statistics based on whether the detected threshold voltage state of the at least one multi-bit cell corresponds to the N-bit data.

In example embodiments, the multi-bit programming method may determine any one of the first interval and the second interval according to the generated statistics.

In operation S730, the multi-bit programming method programs the N-bit data in the at least one multi-bit cell by performing 'N' page programming operations.

In example embodiments, each of the 'N' page programming operations is performed based on any one of the first interval and the second interval.

The multi-bit programming method according to example embodiments may be recorded in computer-readable media including program instructions to implement various operations embodied by a computer. The media may also include, alone or in combination with the program instructions, data files, data structures, and the like. The media and program instructions may be those specially designed and constructed for the purposes of example embodiments, or they may be of the kind well-known and available to those having skill in the computer software arts. Examples of computer-readable media include magnetic media such as hard disks, floppy disks, and magnetic tape; optical media such as CD ROM disks and DVD; magneto-optical media such as optical disks; and hardware devices that are specially configured to store and perform program instructions, such as read-only memory (ROM), random access memory (RAM), flash memory, and the like. Examples of program instructions include both machine code, such as produced by a compiler, and files containing higher level code that may be executed by the computer using an interpreter. The described hardware devices may be configured to act as one or more software modules in order to perform the operations of example embodiments.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. Therefore, it is intended that the scope of the invention be defined by the claims appended thereto and their equivalents.

While example embodiments have been particularly shown and described, it will be understood by those of ordinary skill in the art that various changes in form and details may be made therein without departing from the spirit and scope of the present invention as defined by the following claims.

What is claimed is:

1. A multi-bit programming apparatus that programs N-bit data in at least one multi-bit cell, the apparatus comprising:
   a first control unit that allocates any one of $2^N$ threshold voltage states to the N-bit data;
   a second control unit that spaces, by any one of different $2^N-1$ intervals, adjacent threshold voltage states of the $2^N$ threshold voltage states;
   a programming unit that programs the N-bit data by generating, in each of the at least one multi-bit cell, a distribution state corresponding to the allocated threshold voltage state; and
   a verification unit that verifies whether the distribution state corresponding to the allocated threshold voltage state is generated by comparing a threshold voltage of the at least one multi-bit cell and a verification voltage,
   wherein the second control unit spaces, by any one of the $2^N-1$ intervals, the adjacent threshold voltage states by adjusting the verification voltage.

2. The apparatus of claim 1, wherein the second control unit selects threshold voltage states of the $2^N$ threshold voltage states as a first threshold voltage state group, the selected threshold voltage states having a threshold voltage higher than a reference voltage, and
   spaces, by any one of the $2^N-1$ intervals, the adjacent threshold voltage states of the selected first threshold voltage state group.

3. The apparatus of claim 1, wherein the second control unit spaces, by any one of a first interval and a second interval of the different $2^N-1$ intervals, the adjacent threshold voltage states of the $2^N$ threshold voltage states.

4. The apparatus of claim 1, wherein the second control unit adjusts the intervals to have a negative correlation to a threshold voltage of the threshold voltage states.

5. The apparatus of claim 1, further comprising:
   a detection unit that detects a threshold voltage state of the at least one multi-bit cell by comparing a threshold voltage of the at least one multi-bit cell and a detection voltage.

6. The apparatus of claim 5, wherein the $2^N-1$ intervals are determined according to statistics based on whether the threshold voltage state detected by the detection unit corresponds to the N-bit data.

7. The apparatus of claim 3, wherein the programming unit programs the N-bit data in the at least one multi-bit cell by performing 'N' page programming operations.

8. The apparatus of claim 7, wherein, when an error rate is higher than an error correcting capability corresponding to an L-th page programming operation being any one of the 'N' page programming operations, the second control unit performs an adjustment to increase an interval between threshold voltage states corresponding to the L-th page programming operation.

9. A multi-bit programming method that programs N-bit data in at least one multi-bit cell, the method comprising:
- allocating any one of $2^N$ threshold voltage states to the N-bit data;
- spacing, by any one of different $2^N-1$ intervals, adjacent threshold voltage states of the $2^N$ threshold voltage states;
- programming the N-bit data in each of the at least one multi-bit cell by generating, in each of the at least one multi-bit cell, a distribution state corresponding to the allocated threshold voltage state; and
- verifying whether the distribution state corresponding to the allocated threshold voltage state is generated by comparing a threshold voltage of the at least one multi-bit cell and a verification voltage, wherein
- the spacing spaces, by any one of the $2^N-1$ intervals, the adjacent threshold voltage states by adjusting the verification voltage.

10. The method of claim 9, further comprising:
- selecting threshold voltage states of the $2^N$ threshold voltage states as a first threshold voltage state group, the selected threshold voltage states having a threshold voltage higher than a reference voltage,
- wherein the spacing spaces, by any one of the $2^N-1$ intervals, the adjacent threshold voltage states of the selected first threshold voltage state group.

11. The method of claim 9, further comprising:
- detecting a threshold voltage state of the at least one multi-bit cell by comparing a threshold voltage of the at least one multi-bit cell and a detection voltage.

12. The method of claim 11, further comprising:
- determining the $2^N-1$ intervals according to statistics based on whether the detected threshold voltage state of the at least one multi-bit cell corresponds to the N-bit data.

13. The method of claim 9, wherein the programming programs the N-bit data in the at least one multi-bit cell by performing 'N' page programming operations.

14. The method of claim 13, wherein each of the 'N' page programming operations is performed based on any one of a first interval and a second interval of the different $2^N-1$ intervals.

15. A computer-readable recording medium storing a program for implementing a multi-bit programming method that programs N-bit data in at least one multi-bit cell, the method comprising:
- allocating any one of $2^N$ threshold voltage states to the N-bit data;
- spacing, by any one of different $2^N-1$ intervals, adjacent threshold voltage states of the $2^N$ threshold voltage states;
- programming the N-bit data in each of the at least one multi-bit cell by generating, in each of the at least one multi-bit cell, a distribution state corresponding to the allocated threshold voltage state; and
- verifying whether the distribution state corresponding to the allocated threshold voltage state is generated by comparing a threshold voltage of the at least one multi-bit cell and a verification voltage,
- wherein the spacing spaces, by any one of the $2^N-1$ intervals, the adjacent threshold voltage states by adjusting the verification voltage.

16. The apparatus of claim 1, wherein the second control unit performs an adjustment to increase the interval between the threshold voltage states as the threshold voltage of the $2^N$ threshold voltage states decreases.

17. The apparatus of claim 7, wherein each of the 'N' page programming operations are performed based on any one of the first interval and the second interval.

18. The method of claim 9, wherein the spacing spaces, by any one of a first interval and a second interval, the adjacent threshold voltage states of the $2^N$ threshold voltage states.

19. The method of claim 9, wherein the spacing performs an adjustment to increase the interval between the threshold voltage states as the threshold voltage of the $2^N$ threshold voltage states decreases.

* * * * *